United States Patent
Chen et al.

(10) Patent No.: US 9,607,878 B2
(45) Date of Patent: Mar. 28, 2017

(54) SHALLOW TRENCH ISOLATION AND FORMATION THEREOF

(71) Applicant: Taiwan Semiconductor Manufacturing Company Limited, Hsin-Chu (TW)

(72) Inventors: Ming-Hui Chen, Tainan (TW); Chuan-Ping Hou, YongKong (TW); Chih-Ho Tai, Tainan (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 127 days.

(21) Appl. No.: 14/070,731

(22) Filed: Nov. 4, 2013

(65) Prior Publication Data

US 2015/0123239 A1    May 7, 2015

(51) Int. Cl.
*H01L 21/76* (2006.01)
*H01L 21/762* (2006.01)

(52) U.S. Cl.
CPC .............................. *H01L 21/76224* (2013.01)

(58) Field of Classification Search
CPC ........... H01L 21/76224; H01L 29/0649; H01L 29/0653; H01L 29/66795; H01L 21/02164
USPC .......................................... 438/437; 257/506
See application file for complete search history.

(56) References Cited

U.S. PATENT DOCUMENTS

| | | | |
|---|---|---|---|
| 5,717,628 A | 2/1998 | Hammerl et al. | |
| 5,940,717 A | 8/1999 | Rengarajan et al. | |
| 6,596,607 B2 | 7/2003 | Ahn | |
| 6,627,514 B1* | 9/2003 | Park | H01L 21/76232 257/E21.549 |
| 6,794,269 B1* | 9/2004 | Gopalan et al. | 438/427 |
| 6,960,818 B1* | 11/2005 | Rengarajan et al. | 257/510 |
| 2005/0023634 A1* | 2/2005 | Yoon et al. | 257/506 |
| 2007/0205489 A1* | 9/2007 | Tilke et al. | 257/618 |
| 2008/0020534 A1* | 1/2008 | Culmsee et al. | 438/296 |
| 2008/0160718 A1* | 7/2008 | Lee | H01L 21/76232 438/425 |
| 2008/0194075 A1* | 8/2008 | Wu | 438/425 |

OTHER PUBLICATIONS

Corresponding Taiwan Application, Taiwan Office action dated Sep. 11, 2015, 4 pages.

* cited by examiner

*Primary Examiner* — Andy Huynh
(74) *Attorney, Agent, or Firm* — Cooper Legal Group, LLC

(57) ABSTRACT

One or more methods of forming shallow trench isolation (STI) and resulting semiconductor arraignments are provided. A method of forming STI includes forming a nitride liner in a first opening and second opening and recessing the nitride liner in the first opening and second opening while forming an oxide structure in the first opening and second opening, thus forming a first STI region in the first opening and a second STI region in the second opening. A semiconductor arraignment includes a first STI region in an active area and a second STI region in an isolation area, where a first recessed nitride layer height in the first STI region is different than a second recessed nitride layer height in the second STI region.

20 Claims, 4 Drawing Sheets

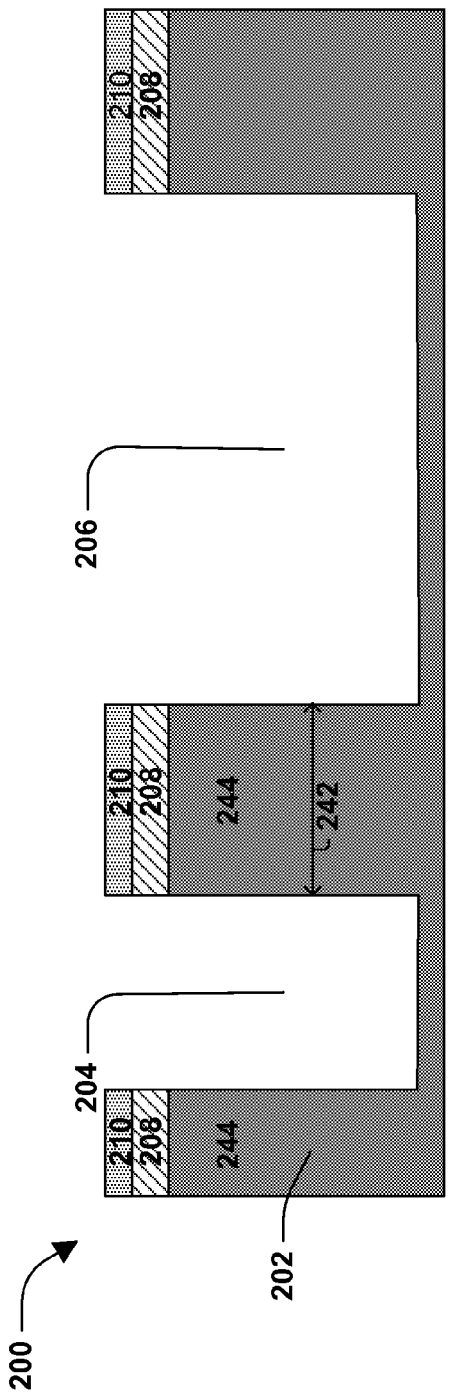
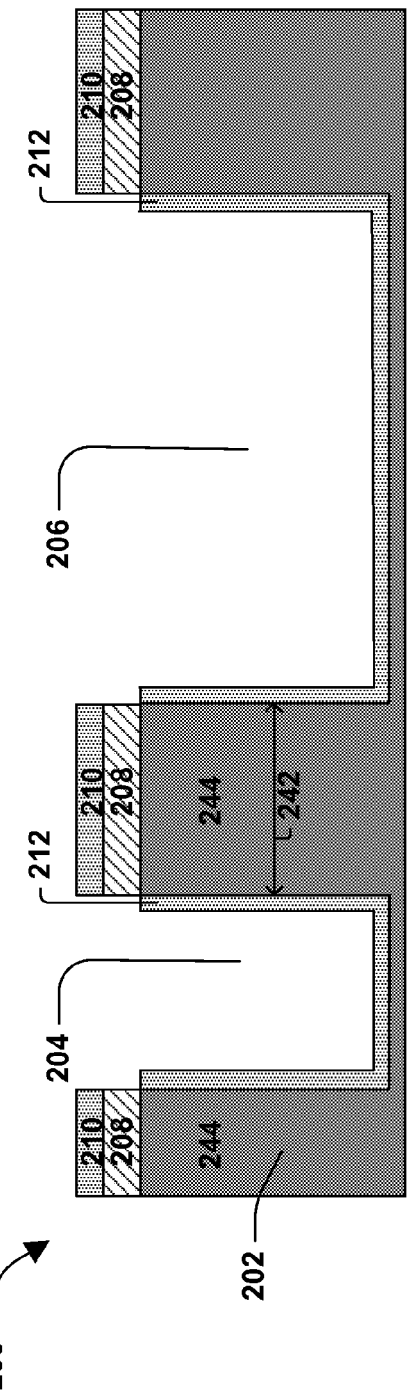
FIG. 2
FIG. 3

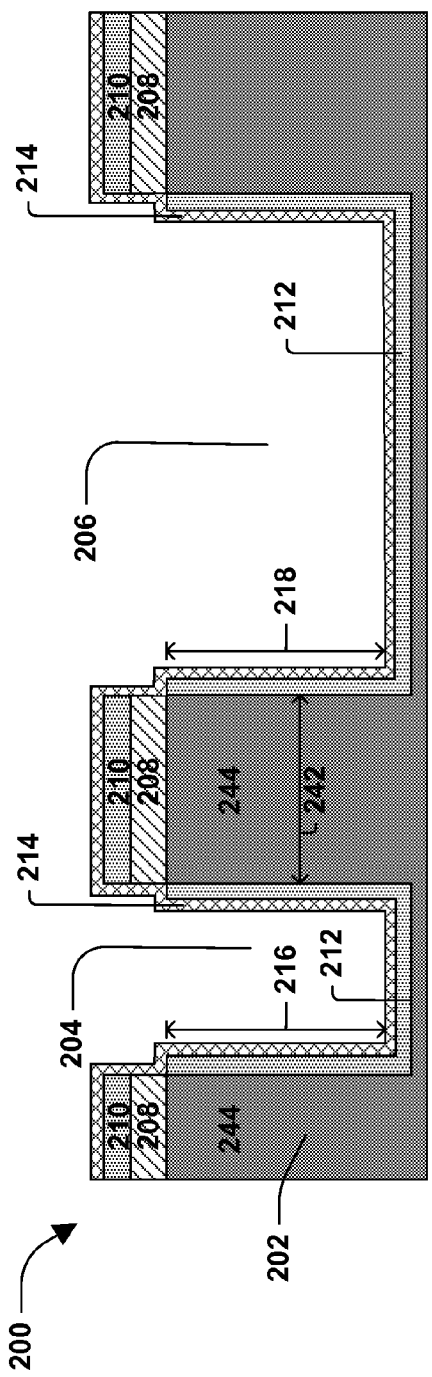
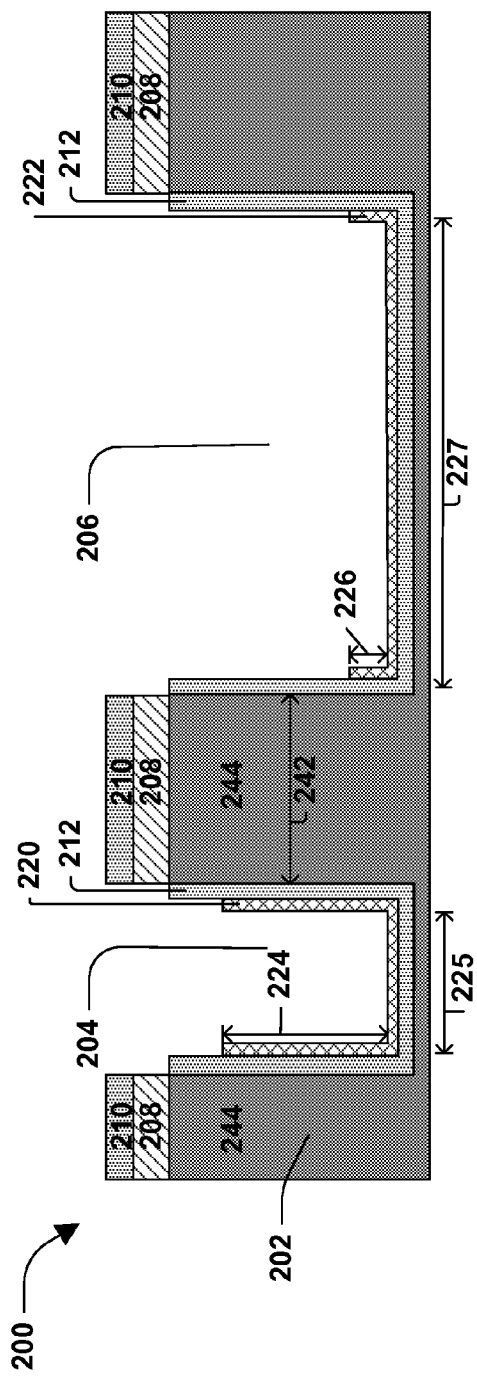

SHALLOW TRENCH ISOLATION AND FORMATION THEREOF

BACKGROUND

Shallow trench isolation (STI) is used to electrically isolate materials or devices from one another in semiconductor technologies.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased or reduced for clarity of discussion.

FIG. 2 is an illustration of a semiconductor arraignment, according to some embodiments.

FIG. 3 is an illustration of a semiconductor arraignment, according to some embodiments.

FIG. 4 is an illustration of a semiconductor arraignment, according to some embodiments.

FIG. 5 is an illustration of a semiconductor arraignment, according to some embodiments.

DETAILED DESCRIPTION

Figure 1:
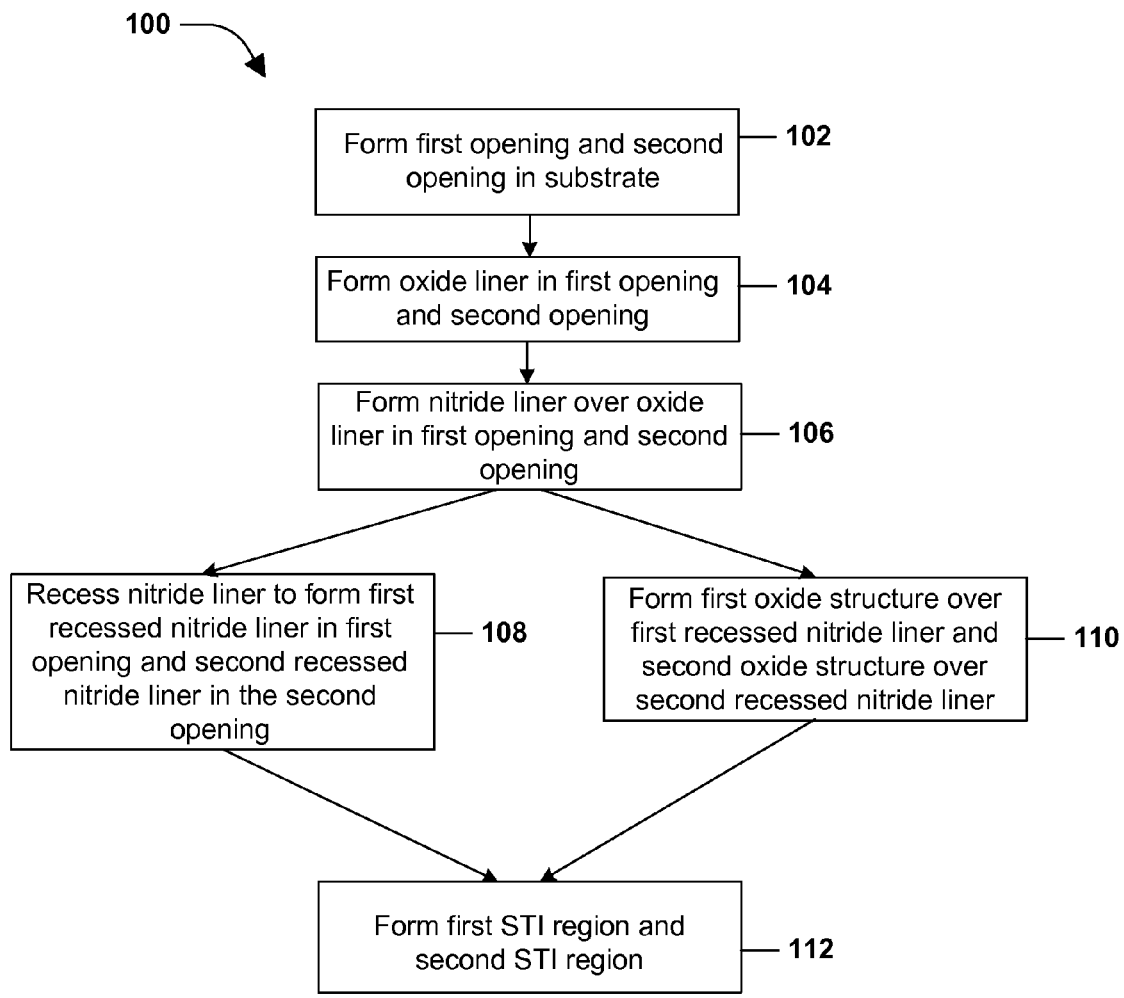
FIG. 1 is a flow diagram illustrating a method of forming shallow trench isolation (STI), according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more methods of forming a semiconductor arraignment are provided herein. In some embodiments, shallow trench isolation (STI) is formed by forming a first opening and a second opening in a substrate, forming an oxide layer in the first opening and the second opening, forming a nitride liner over the oxide liner within the first opening and the second opening, recessing the nitride liner to create a first recessed nitride liner in the first opening, and a second recessed nitride liner in the second opening and concurrently with the recessing forming a first oxide structure over the first recessed nitride liner to form a first STI region and a second oxide structure over the second recessed liner to form a second STI region. In some embodiments, the first recessed nitride liner has a first recessed height and the second recessed nitride liner has a second recessed height, such that the first recessed height is different than the second recessed height. In some embodiments, the recessing is performed via sputtering. In some embodiments, the sputtering comprises using at least one of argon (Ar) gas, oxygen ($O_2$) gas, helium (He) gas, hydrogen ($H_2$) gas or nitrogen ($N_2$) gas. In some embodiments, the first oxide structure and the second oxide structure are formed via deposition. In some embodiments the deposition comprises a high density plasma (HDP) chemical vapor deposition (CVD) using at least one of oxygen ($O_2$) gas or silane ($SiH_4$) gas. In some embodiments, the deposition and the recessing are preformed in a processing chamber. In some embodiments, the deposition and recessing are preformed without removing the substrate from the processing chamber. In some embodiments, the $O_2$ gas in situ recesses the nitride liner while the $O_2$ gas and $SiH_4$ gas form the first oxide structure and the second oxide structure.

A semiconductor arraignment is provided, where the semiconductor arrangement comprises a first shallow trench isolation (STI) region and a second STI region. The first STI region comprises a first recessed nitride liner having a first recessed height, and a first oxide structure over the first recessed nitride liner. The second STI region comprises a second recessed nitride liner having a second recessed height, and a second oxide structure over the second recessed nitride liner. The semiconductor arrangement, comprising STI, is useful for various purposes, such as preventing current leakage in high voltage devices and extending the operating lifetime of such devices. In some embodiments, the first recessed height is a function of a first recessed liner width and the second recessed height is a function of a second recessed liner width. In some embodiments, the first recessed liner width is less than the second recessed liner width. In some embodiments, the first recessed height is at least 1.5 times the second recessed height. In some embodiments, the first recessed liner height is between about 1.1 to about 2 times the first recessed width. In some embodiments, the second recessed liner height is between about 0.2 to about 1 times the second recessed width. In some embodiments, the first recessed height is greater than the second recessed height. In some embodiments, the first recessed height is between about 0.5 to about 0.9 times an unrecessed height of a nitride liner. In some embodiments, the second recessed height is between about 0.1 to about 0.5 times the unrecessed height of a nitride liner. In some embodiments, the first STI region is in an active area. In some embodiments, the active area comprises at least one active element. In some embodiments, the active element is at least one of a high voltage device, a low voltage device or a transistor. In some embodiments, the second STI region is in an isolation area. In some embodiments, the isolation area comprises an area with few to no active elements. In some embodiments any number of STI regions are contemplated. Although not illustrated, in some embodiments a STI region is formed in the active area, where few to no STI regions are formed in the isolation area. In some embodiments, a STI region is formed in the isolation area, where few to no STI regions are formed in the active area. In some embodiments at least one STI region is formed in the active area. In some embodiments, at least one STI region is formed in the isolation area.

Figure 6:
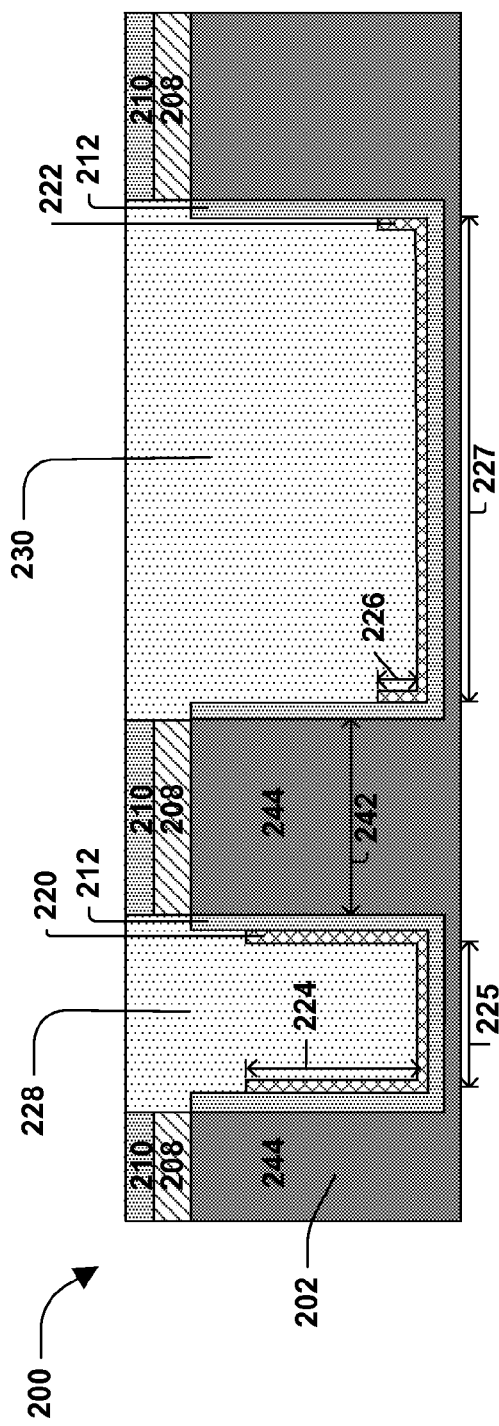
FIG. 6 is an illustration of semiconductor arraignment, according to some embodiments.
Figure 7:
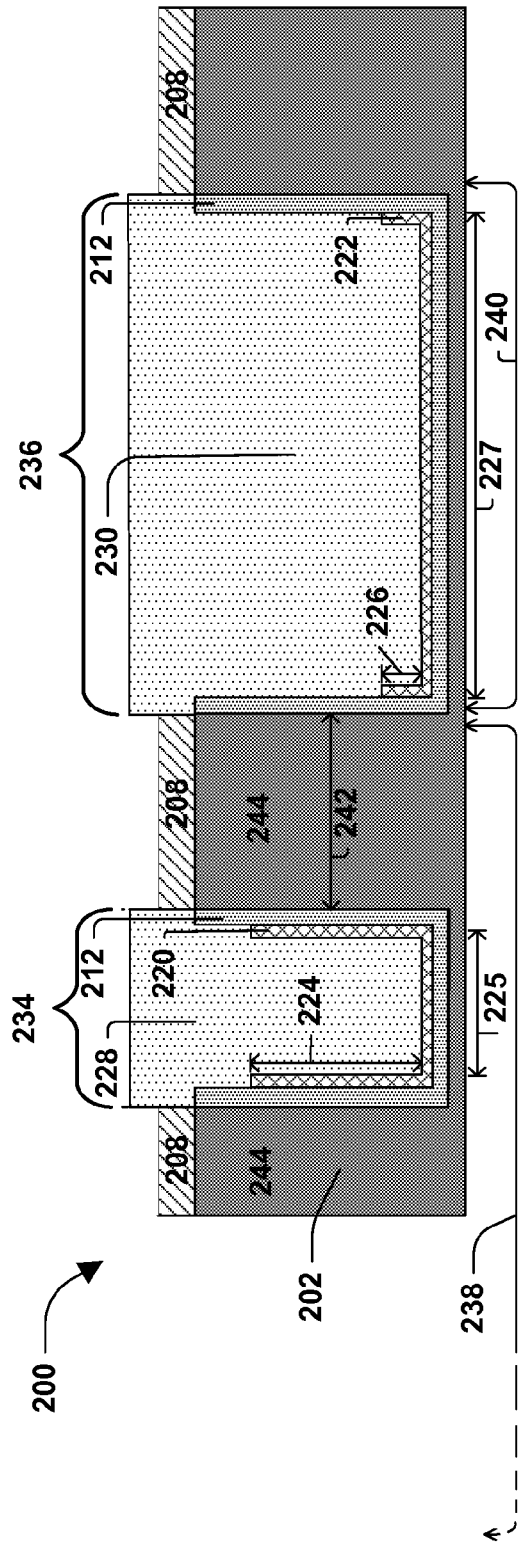
FIG. 7 is an illustration of a semiconductor arraignment, according to some embodiments.

A method 100 of forming a semiconductor arraignment 200 is illustrated in FIG. 1, and one or more semiconductor arraignments formed by such a methodology are illustrated in FIGS. 2-7. As illustrated in FIG. 7, the semiconductor arraignment 200, comprises a first STI region 234 in an active area 238 of a substrate 202, the first STI region 234 comprising a first recessed nitride liner 220 and a first oxide structure 228 formed over the first recessed nitride liner 220, and a second STI region 236 in an isolation area 240 of the substrate 202, the second STI region 236 comprising a second recessed nitride liner 222 and a second oxide structure 230 formed over the second recessed nitride liner 222.

At 102, a first opening 204 and a second opening 206 are formed in the substrate 202, such as via etching, as illustrated in FIG. 2. In some embodiments, the substrate 202 comprises at least one of an epitaxial layer, a silicon-on-insulator (SOI) structure, a wafer, or a die formed from a wafer. In some embodiments, prior to forming the first opening 204 and the second opening 206 in the substrate 202, a layer of oxide material is formed over the substrate and a layer of nitride material is formed over the layer of oxide material. In some embodiments, the layer of oxide material is grown. In some embodiments, the layer of oxide material is grown at high temperature. In some embodiments, the layer of nitride material is grown. In some embodiments, the layer of nitride material is grown at high temperature. In some embodiments, at least some of the layer of oxide material and the layer of nitride material are removed when the first opening 204 and the second 206 opening are formed such that a pad oxide 208 over the substrate 202 and a pad nitride 210 over the pad oxide 208 persist after the first opening 204 and second opening 206 are formed. In some embodiments, the pad oxide 208 has a thickness of between about 50 Å to about 150 Å. In some embodiments, the pad nitride 210 has a thickness of between about 900 Å to about 1800 Å.

At 104, an oxide layer 212 is formed in the first opening 204 and the second opening 206, as illustrated in FIG. 3. In some embodiments, the oxide layer 212 is grown. In some embodiments, the oxide layer 212 is grown by exposure to oxygen ($O_2$) gas. In some embodiments, the oxide layer 212 has a thickness of between about 100 Å to about 400 Å.

At 106, a nitride liner 214 is formed over the oxide liner 212 in the first opening 204 and the second opening 206, as illustrated in FIG. 4. In some embodiments, the nitride liner 214 formed in the first opening 204 has a first unrecessed height 216. In some embodiments, the nitride liner 214 formed in the second opening 206 has a second unrecessed height 218. In some embodiments, the nitride liner 214 is formed by deposition. In some embodiments, the deposition is implemented using a low pressure temperature furnace. In some embodiments, a temperature associated with the deposition is between about 600° C. to about 700° C. In some embodiments, a pressure associated with the deposition is between about 0.15 torr to about 0.3 torr. In some embodiments, the deposition is performed using at least one of dichlorosilane ($SiH_2Cl_2$) gas or ammonia ($NH_3$) gas. In some embodiments, the nitride liner 214 has a thickness of between about 20 Å to about 200 Å.

At 108, the nitride liner 214 is recessed to form a first recessed nitride liner 220 in the first opening 204 and a second recessed nitride liner 222 in the second opening 206, as illustrated in FIG. 5. In some embodiments, the nitride liner 214 is recessed via sputtering. In some embodiments, the sputtering is performed using oxygen ($O_2$) gas. In some embodiments, the $O_2$ in situ sputters the nitride liner. In some embodiments, the first recessed nitride liner 220 has a first recessed height 224 and a first recessed liner width 225. In some embodiments, the first recessed height 224 is between about 1.1 to about 2 times the first recessed liner width 225. In some embodiments, the first recessed height 224 is about 0.44 μm and the first recessed liner width 225 is about 0.4 μm. In some embodiments, the first recessed height 224 is about 0.8 μm and the first recessed liner width 225 is about 0.4 μm. In some embodiments, the first recessed height 224 is about 0.66 μm and the first recessed liner width 225 is about 0.6 μm. In some embodiments, the first recessed height 224 is about 1.2 μm and the first recessed liner width 225 is about 0.6 μm. In some embodiments, the second recessed nitride liner 222 has a second recessed height 226 and a second recessed liner width 227. In some embodiments, the second recessed height 226 is between about 0.2 to about 1 times the second recessed liner width 227. In some embodiments, the second recessed height 226 is about 0.18 μm and the second recessed liner width 227 is about 0.9 μm. In some embodiments, the second recessed height 226 is about 0.9 μm and the second recessed liner width 227 is about 0.9 μm. In some embodiments, the second recessed height 226 is about 0.24 μm and the second recessed liner width 227 is about 1.2 μm. In some embodiments, the second recessed height 226 is about 1.2 μm and the second recessed liner width 227 is about 1.2 μm.

In some embodiments, the first recessed liner height 224 and the second recessed liner height 226 are different. In some embodiments, a wider width of the second opening 206 relative to a width of the first opening 204 allows more of the nitride liner 214 to be recessed in the second opening 206 than in the first opening 204, such that the first recessed liner height 224 is greater than the second recessed liner height 226. In some embodiments, the wider width of the second opening 206 more readily exposes the nitride liner 214 to one or more recessing substances, such as Ar, relative to the exposure afforded by the less wide first opening 204. The one or more recessing substances thus remove or recess a greater amount of the nitride liner 214 in the second opening 206 than in the first opening 204. In some embodiments, the first recessed liner height 224 is at least 1.5 times the second recessed liner height 226. In some embodiments, the first recessed liner height 224 is about 4.5 μm and the second recessed liner height 226 is about 3 μm. In some embodiments, the first recessed liner height 224 is about 1.35 μm and the second recessed liner height 226 is about 0.9 μm. In some embodiments, the first recessed liner height 224 is about 2.7 μm and the second recessed liner height 226 is about 0.9 μm. In some embodiments, the first recessed height 224 is between about 0.5 to about 0.9 times the first unrecessed liner height 216. In some embodiments, the first recessed height 224 is about 0.5 μm and the first unrecessed liner height 216 is about 1 μm. In some embodiments, the first recessed height 224 is about 0.6 μm and the first unrecessed liner height 216 is about 1.2 μm. In some embodiments, the first recessed height 224 is about 0.9 μm and the first unrecessed liner height 216 is about 1 μm. In some embodiments, the first recessed height 224 is about 1.1 μm and the first unrecessed liner height 216 is about 1.2 μm. In some embodiments, the second recessed height 226 is between about 0.1 to about 0.5 times the second unrecessed liner height 218. In some embodiments, the second recessed height 226 is about 0.1 μm and the second unrecessed liner height 218 is about 1 μm. In some embodiments, the first recessed height 226 is about 0.12 μm and the second unrecessed liner height 218 is about 1.2 μm. In some embodiments, the second recessed height 226 is about 0.5 μm and the second unrecessed liner height 218 is about 1 μm. In some embodiments, the second recessed height 226 is about 0.6 μm and the second unrecessed liner height 218 is about 1.2 μm.

At 110, a first oxide structure 228 is formed over the first recessed nitride liner 220 and a second oxide structure 230 is formed over the second recessed nitride liner 222 during the recessing of the nitride liner 214 at 108, as illustrated in FIG. 6. In some embodiments, the first oxide structure 228 and the second oxide structure 230 are formed by deposition. In some embodiments, the deposition comprises high density plasma (HDP) CVD. In some embodiments, the HDP CVD uses a high RF power of between about 1000 W to about 5000 W. In some embodiments, the HDP CVD occurs at a temperature of between about 50° C. to about 750° C. In some embodiments, the HDP CVD occurs at a pressure of between about 1 mtorr to about 30 mtorr. In some embodiments, the HDP CVD comprises using at least one of $O_2$ gas and $SiH_4$ gas. In some embodiments, the deposition of the first oxide structure 228 and the second oxide structure 230 is performed in a processing chamber. In some embodiments, the deposition of the first oxide structure 228 and the second oxide structure 230 is performed in the same processing chamber as the recessing of the nitride liner 214. In some embodiments, the recessing of the nitride liner 214 and the formation of the first oxide structure 228 and the second oxide structure 230 is completed without removing the substrate 202 from the processing chamber. In some embodiments, the $O_2$ gas in situ recesses the nitride liner 214 while the $O_2$ gas and $SiH_4$ gas form the first oxide structure 228 and the second oxide structure 230. In some embodiments, the first oxide structure 228 and the second oxide structure 230 are planerized by chemical mechanical polishing (CMP).

At 112, a first STI region 234 and a second STI region 236 are formed, such as after the pad nitride 210 is removed, as illustrated in FIG. 7. In some embodiments, the first STI region 234 comprises the first oxide structure 228, the first recessed nitride liner 220, and the oxide liner 212. In some embodiments, the second STI region 236 comprises the second oxide structure 230, the second recessed nitride liner 222, and the oxide liner 212. In some embodiments, the first STI region 234 is formed in an active area 238. In some embodiments, the active area 238 comprises at least one active element, and thus the active area 238 is illustrated as extending further on the page. In some embodiments, an active element is at least one of a high voltage device, a low voltage device or a transistor. In some embodiments, an active element is located in an active element area 244, having an active element width 242. In some embodiments, the second STI region 236 is formed in an isolation area 240. In some embodiment, the isolation area 240 has few to no active elements as the isolation areas 240 separates one active area 238 from another active area 238. In some embodiments, the isolation area 240 has less active elements than the active region 238. In some embodiments, the pad nitride 210 is removed. In some embodiments, the pad nitride 210 is removed using a wet etch. In some embodiments, the wet etch comprises using phosphoric acid ($H_3PO_4$). In some embodiments at least one STI region is formed in the active area. In some embodiments, at least one STI region is formed in the isolation area.

In some embodiments, a method of forming a shallow trench isolation (STI) comprises forming a first opening in a substrate, forming an oxide liner within the first opening, forming a nitride liner over the oxide liner within the first opening, recessing the nitride liner to create a first recessed nitride liner within the first opening such that a first recessed height of the first recessed nitride liner within the first opening is less than a first unrecessed height of the nitride liner within the first opening and forming a first oxide structure over the first recessed nitride liner during the recessing to form a first STI region.

In some embodiments, a method of forming a shallow trench isolation (STI), comprises forming a first opening and a second opening in a substrate, forming an oxide liner within the first opening and within the second opening, forming a nitride liner over the oxide liner within the first opening and within the second opening, recessing the nitride liner to create a first recessed nitride liner within the first opening and a second recessed nitride liner within the second opening, such that a first recessed height of the first recessed nitride liner within the first opening is less than a first unrecessed height of the nitride liner within the first opening and a second recessed height of the second recessed nitride liner within the second opening is less than a second unrecessed height of the nitride liner within the second opening, and such that the first recessed height is different than the second recessed height, and forming a first oxide structure over the first recessed nitride liner to form a first STI region and forming a second oxide structure over the second recessed nitride liner to form a second STI region during the recessing.

In some embodiments, a semiconductor arrangement on a substrate comprises a first STI region in an active area of the semiconductor arrangement and a second STI region in an isolation area of the semiconductor arrangement. In some embodiments, the first STI region comprises a first recessed nitride liner within a first opening within the substrate, the first recessed nitride liner having a first recessed height and a first oxide structure over the first recessed nitride liner. In some embodiments, the second STI region comprises a second recessed nitride liner within a second opening within the substrate, the second recessed nitride liner having a second recessed height and a second oxide structure over the second recessed nitride liner. In some embodiments, the first recessed height is different than the second recessed height.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B.

Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming one or more shallow trench isolation (STI) regions, comprising:
    forming a first opening and a second opening in a substrate, a width of the second opening different than a width of the first opening;
    forming an oxide liner within the first opening and within the second opening;
    forming a nitride liner over a top surface of the oxide liner and a sidewall of the oxide liner within the first opening and within the second opening;
    performing a sputtering process to recess the nitride liner to create a first recessed nitride liner within the first opening and a second recessed nitride liner within the second opening, wherein:
        the sputtering process re-exposes the top surface of the oxide liner and a portion of the sidewall of the oxide liner within the first opening, and
        a height of the first recessed nitride liner is different than a height of the second recessed nitride liner due to the width of the first opening being different than the width of the second opening; and
    forming a first oxide structure over the first recessed nitride liner during the recessing to form a first STI region, the first oxide structure contacting a sidewall of the first recessed nitride liner and the portion of the sidewall of the oxide liner within the first opening.

2. The method of claim 1, the forming a first oxide structure comprising filling the first opening with an oxide based material.

3. The method of claim 1, the forming a first oxide structure comprising forming the first oxide structure over the first recessed nitride liner without removing the substrate from a processing chamber.

4. The method of claim 1, the sputtering process performed in a processing chamber and the forming a first oxide structure performed in the processing chamber.

5. The method of claim 1, wherein there are no additional layers formed between the forming a nitride liner and the forming a first oxide structure.

6. The method of claim 1, the sputtering process comprising using at least one of oxygen ($O_2$) gas or argon (Ar) gas.

7. The method of claim 1, the forming a first oxide structure performed via deposition.

8. The method of claim 7, the deposition comprising a high density plasma (HDP) chemical vapor deposition (CVD) using at least one of oxygen ($O_2$) gas or silane ($SiH_4$) gas.

9. A method of forming shallow trench isolation (STI), comprising:
    forming a first opening and a second opening in a substrate;
    forming an oxide liner within the first opening and within the second opening;
    forming a nitride liner over the oxide liner within the first opening and within the second opening;
    recessing the nitride liner to create a first recessed nitride liner within the first opening and a second recessed nitride liner within the second opening such that a first recessed height of the first recessed nitride liner within the first opening is less than a first unrecessed height of the nitride liner within the first opening and a second recessed height of the second recessed nitride liner within the second opening is less than a second unrecessed height of the nitride liner within the second opening, the first recessed height different than the second recessed height; and
    forming a first oxide structure over the first recessed nitride liner to form a first STI region and forming a second oxide structure over the second recessed nitride liner to form a second STI region during the recessing.

10. The method of claim 9, the recessing performed via sputtering.

11. The method of claim 10, the sputtering comprising using at least one of oxygen ($O_2$) gas or argon (Ar) gas.

12. The method of claim 9, the forming a first oxide structure and the forming a second oxide structure performed via deposition.

13. The method of claim 12, the deposition comprising a high density plasma (HDP) chemical vapor deposition (CVD) using at least one of oxygen ($O_2$) gas or silane ($SiH_4$) gas.

14. A semiconductor arrangement on a substrate comprising:
    a first shallow trench isolation (STI) region in an active area of the semiconductor arrangement, the first STI region comprising:
        a first recessed nitride liner within a first opening within the substrate, the first recessed nitride liner having a first recessed height; and
        a first oxide structure over the first recessed nitride liner; and
    a second STI region in an isolation area of the semiconductor arrangement, the second STI region comprising:
        a second recessed nitride liner within a second opening within the substrate, the second recessed nitride liner having a second recessed height; and
        a second oxide structure over the second recessed nitride liner, the first recessed height different than the second recessed height.

15. The semiconductor arrangement of claim 14, the first recessed height is at least 1.5 times the second recessed height.

16. The semiconductor arrangement of claim 14, the first recessed nitride liner having a first recessed liner width and the second recessed nitride liner having a second recessed liner width, the first recessed liner width different than the second recessed liner width.

17. The semiconductor arrangement of claim 16, wherein the first recessed height is between about 1.1 to about 2 times the first recessed liner width.

18. The semiconductor arrangement of claim 16, wherein the second recessed height is between about 0.2 to about 1 times the second recessed liner width.

19. The semiconductor arrangement of claim 14, the first STI region comprising an oxide liner, wherein the first recessed nitride liner is disposed between the oxide liner and the first oxide structure.

20. The semiconductor arrangement of claim 19, wherein the first oxide structure is in contact with the oxide liner above the first recessed nitride liner.

* * * * *